US009502458B2

(12) United States Patent
Parmesan

(10) Patent No.: US 9,502,458 B2
(45) Date of Patent: Nov. 22, 2016

(54) CIRCUIT FOR GENERATING DIRECT TIMING HISTOGRAM DATA IN RESPONSE TO PHOTON DETECTION

(71) Applicant: STMicroelectronics (Research & Development) Limited, Marlow, Buckinghamshire (GB)

(72) Inventor: Luca Parmesan, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 135 days.

(21) Appl. No.: 14/643,903

(22) Filed: Mar. 10, 2015

(65) Prior Publication Data

US 2016/0268331 A1 Sep. 15, 2016

(51) Int. Cl.

| | |
|---|---|
| ***G01J 11/00*** | (2006.01) |
| ***H01L 27/146*** | (2006.01) |
| ***H04N 5/3745*** | (2011.01) |

(52) U.S. Cl.

CPC ... *H01L 27/14641* (2013.01); *H01L 27/14643* (2013.01); *H04N 5/37455* (2013.01)

(58) Field of Classification Search

CPC ............ G01J 11/00; G01J 3/443; G01J 1/42; G01J 3/4406; G01J 3/44; A61B 5/0071; A61B 5/0091; A61B 5/0059

USPC ........ 250/214.1, 214 R, 208.1, 207, 214 VT, 250/458.1, 459.1; 356/300–328

See application file for complete search history.

(56) References Cited

U.S. PATENT DOCUMENTS

| | | | | |
|---|---|---|---|---|
| 6,346,905 B1 | 2/2002 | Ottini et al. | | |
| 6,965,407 B2 | 11/2005 | Boemler et al. | | |
| 8,432,304 B2 | 4/2013 | Dutton | | |
| 8,669,512 B2 * | 3/2014 | Nevet | ....................... | G01J 1/42 250/214.1 |
| 8,822,900 B2 | 9/2014 | Richardson et al. | | |
| 2007/0096836 A1 | 5/2007 | Lee et al. | | |
| 2009/0141595 A1 | 6/2009 | Huang et al. | | |
| 2010/0134335 A1 | 6/2010 | Park et al. | | |
| 2011/0001492 A1 | 1/2011 | Nys et al. | | |
| 2014/0124652 A1 | 5/2014 | Dutton et al. | | |

* cited by examiner

*Primary Examiner* — Que T Le

(74) *Attorney, Agent, or Firm* — Gardere Wynne Sewell LLP

(57) ABSTRACT

A sensor pixel detects a photon and outputs a first voltage proportional to a time of arrival of the detected photon. This voltage is converted to a multi-bit digital signal in the format of a thermometer code. A number of counter circuits, one counter circuit per bit of the multi-bit digital signal, are provided to accumulate the thermometer coded outputs. Each counter is configured to increment in response to an active logic state of the corresponding bit of the multi-bit digital signal. Accumulated count values in the counter circuits provide a timing histogram with respect to photon detection.

19 Claims, 4 Drawing Sheets

CIRCUIT FOR GENERATING DIRECT TIMING HISTOGRAM DATA IN RESPONSE TO PHOTON DETECTION

TECHNICAL FIELD

The present invention relates to photon detection and, in particular, to a circuit configured to generate direct timing histogram data in response to photon detection.

BACKGROUND

In a number of applications such as time of flight (TOF) and fluorescence lifetime imaging microscopy (FLIM), it is important to not only detect photon reception but also generate data concerning photon arrival time within a given timing window. Embodiments disclosed herein provide a system and method for generating direct timing histogram data with respect to detected photons.

SUMMARY

In an embodiment, a circuit comprises: a first sensor pixel configured to detect a photon and output a first voltage proportional to a time of arrival of the detected photon; a first conversion circuit configured to convert the first voltage output from the sensor pixel to a first multi-bit digital signal in the format of a thermometer code; and a plurality of counter circuits, one counter circuit per bit of the multi-bit digital signal, each counter configured to increment in response to an active logic state of said bit of the multi-bit digital signal, with accumulated count values in said plurality of counter circuits providing a timing histogram with respect to photon detection.

In an embodiment, a method comprises: detecting a photon with a sensor pixel circuit to output a voltage proportional to a time of arrival of the detected photon; converting the voltage output from the sensor pixel to a multi-bit digital signal in the format of a thermometer code; and incrementing individual ones of a plurality of counter circuits, one counter circuit per bit of the multi-bit digital signal, in response to an active logic state of said bit of the multi-bit digital signal with accumulated count values in said plurality of counter circuits providing a timing histogram with respect to photon detection.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
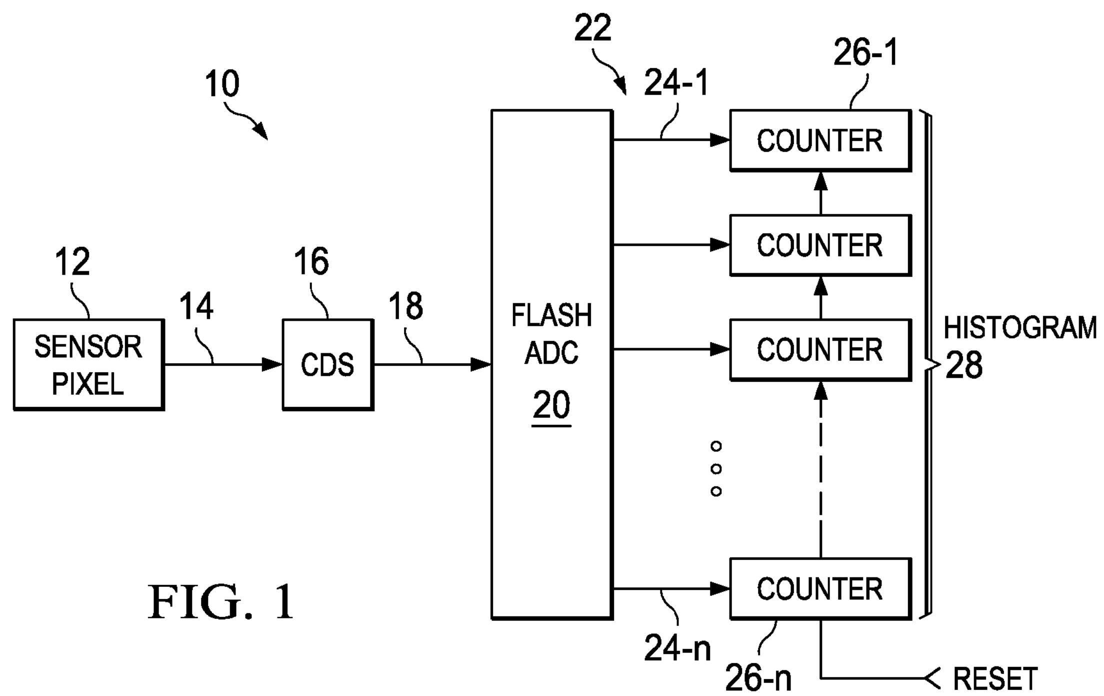
FIG. 1 is a block diagram of an embodiment of a system for generating direct timing histogram data in response to photon detection.

Reference is now made to FIG. 1 showing a block diagram of an embodiment of a system 10 for generating direct timing histogram data in response to photon detection. The system 10 includes a sensor pixel 12 configured to generate a photon detect signal 14 comprising an analog voltage that is proportional to a detected time of arrival of a photon. A correlated double sampling (CDS) circuit 16 receives the photon detect signal 14 and outputs a sampled signal 18 whose voltage is also proportional to the detected time of arrival of the photon. A flash analog-to-digital converter (ADC) circuit 20 receives the sampled signal 18 and generates a multi-bit (n-bit) digital signal 22 in the format of a thermometer code whose digital value is indicative of the time of arrival for the detected photon. The multi-bit digital signal 22 is carried by a corresponding plurality of bit lines 24-1 to **24-*n*. With each detected and sampled photon arrival, the thermometer code of the digital signal 22 will include only one bit line 24 set in an active logic state (for example, logic 1), that active bit line corresponding to a timing window within which the photon was detected. All other bit lines 24 of the thermometer code (corresponding to other timing windows) are set in the inactive logic state (for example, logic 0). Thus, the individual bit lines 24 are each indicative of a certain time range, and the setting of one bit line 24 in the active logic state provides an indication that the detected photon arrived within the time range (window) corresponding to that bit line. The system 10 further includes a corresponding plurality of digital counter circuits 26-1 to 26-*n*, each digital counter circuit 26 having an input coupled to a corresponding one of the bit lines 24-1 to 24-*n*, and thus corresponding to a timing window. Each digital counter circuit 26 responds to assertion of the connected bit line 24 in the active logic state by incrementing a stored count value. Taken over a measurement time period which includes many photon detections, the stored count values in the plurality of digital counter circuits 26 present a direct timing histogram 28** with respect to the timing of photon detection.

Figure 2:
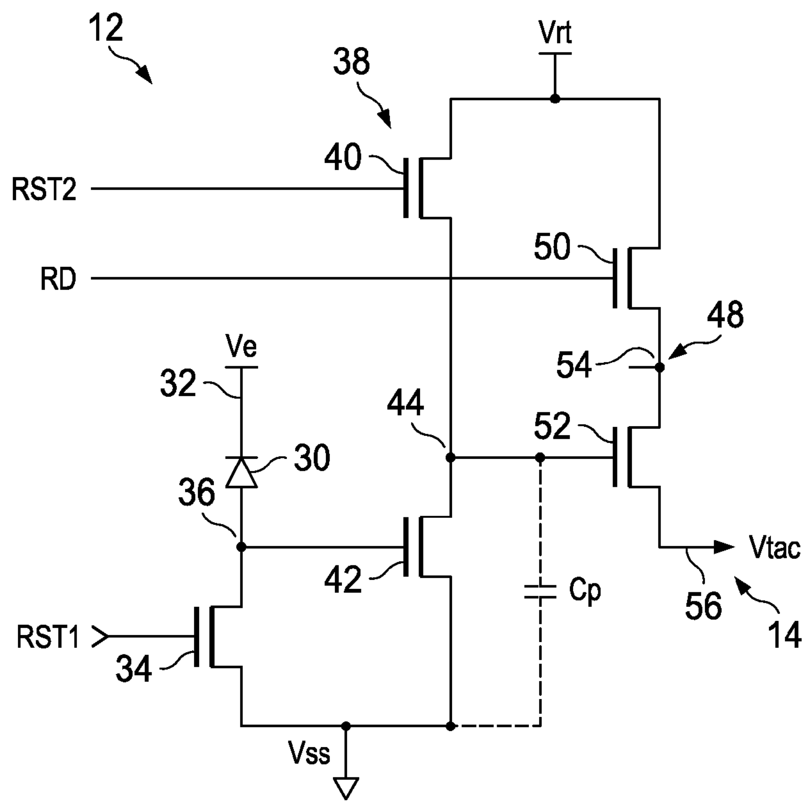
FIG. 2 is a circuit diagram for a sensor pixel within the system of FIG. 1.

Reference is now made to FIG. 2 showing a circuit diagram for an example implementation of the sensor pixel 12. The sensor pixel 12 operates as a SPAD time to analog converter (TAC) sensor. A photodiode 30 includes a cathode terminal connected to a bias node 32 to which is applied a bias voltage Ve. A reset transistor 34 is connected in series with the photodiode 30. In particular, the transistor 34 is of the MOSFET-type with a drain terminal connected to the anode of the photodiode 30 at a sense node 36. The source terminal of transistor 34 is connected to a first reference voltage supply node (Vss, for example, ground). A gate terminal of transistor 34 is coupled to receive a first reset signal (RST1). A charge control circuit 38 is formed by a charging transistor 40 and discharging transistor 42 connected in series. The transistors 40 and 42 are of the MOSFET-type. A drain terminal of transistor 40 is connected to a second reference voltage supply node (Vrt), and a source terminal of transistor 40 is connected to a charge node 44. The gate terminal of transistor 40 is coupled to receive a second reset signal (RST2). A drain terminal of transistor 42 is connected to the charge node 44, and the source terminal of transistor 42 is connected to the first reference supply node (Vss). The gate terminal of transistor 44 is connected to the sense node 36. A read circuit 48 is formed by source-follower circuit including a read control transistor 50 and an output transistor 52 connected in series. The transistors 50 and 52 are of the MOSFET-type. A drain terminal of transistor 50 is connected to the second reference voltage supply node (Vrt), and a source terminal of transistor 50 is connected to a drain terminal of transistor 52 at intermediate node 54. The gate terminal of transistor 50 is coupled to receive a read signal (RD). A source terminal of transistor 52 is connected to an output node 56 and configured to generate a time to analog converter output signal (Vtac) which is the photon detect signal 14. The gate terminal of transistor 52 is connected to the charge node 44.

Figure 3:
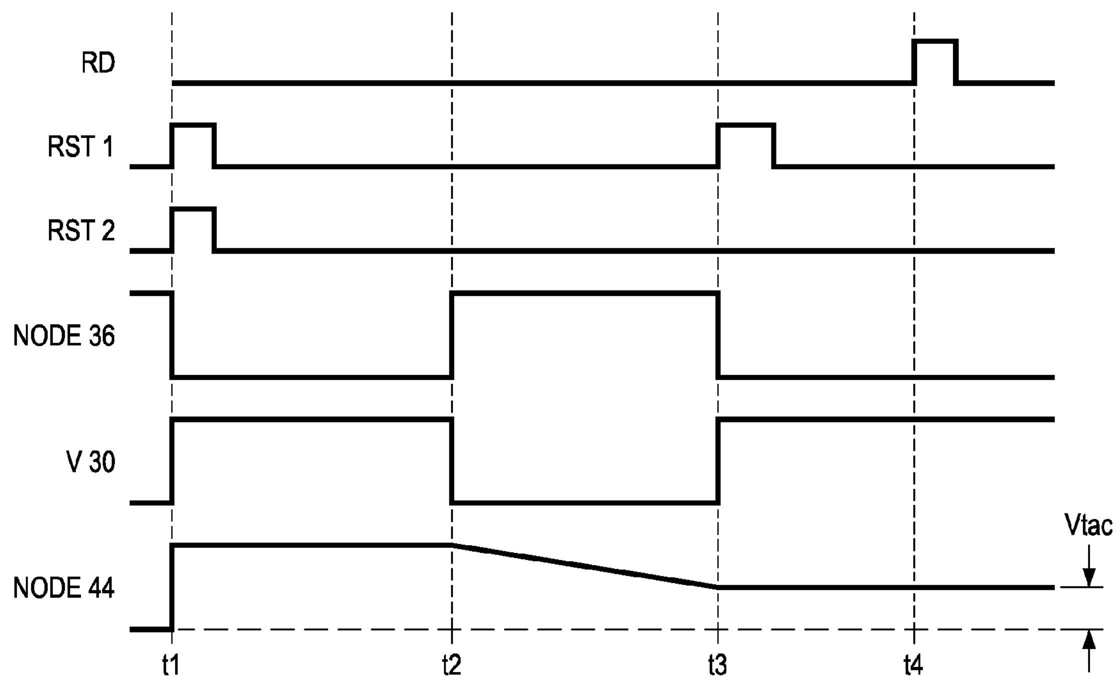
FIG. 3 is a timing diagram for operation of the sensor pixel of FIG. 2.

Reference is now made to FIG. 3 showing a timing diagram for operation of the sensor pixel 12 of FIG. 2. The operation process starts at time t1 when the sensor pixel 12 is armed by pulsing both the first reset signal (RST1) and the second reset signal (RST2). This turns on transistors 34 and 40. As a result, the voltage Ve is applied across the photodiode 30 (as shown with the voltage V30). The voltage Ve is set to a value equal to the sum of the breakdown voltage (Vbd) of the photodiode plus an excess voltage (Vex). The first reference supply node (Vss) in this mode may, for example, be 0V. The gate of transistor 42 (node 36) is thus also at the first reference supply node voltage. The turning on of transistor 40 pulls the voltage at the gate of transistor 52 (node 44) to the voltage at the second reference voltage supply node (Vrt). A parasitic capacitance Cp associated with the gate of transistor 52 is thus charged to the voltage Vrt.

At time t2, a photon is received by the photodiode 30 and avalanche mode begins. The voltage at node 36 rises in response to SPAD mode and transistor 42 begins integrating as a current source to drain the stored charge from the parasitic capacitance associated with the gate of transistor 52. The voltage at node 44 accordingly linearly decays.

At time t3, the first reset signal (RST1) is again pulsed to terminate the integration operation. The remaining voltage at node 44 represents the time between the reception of the photon by the photodiode 30 and the second pulsing of the first reset signal (RST1).

At time t4, the read signal (RD) is pulsed to turn on transistor 50 and start read mode. The transistor 52 functions in source-follower mode to permit reading out of the remaining voltage at node 44 as the time to analog converter output signal (Vtac) (photon detect signal 14).

It will be understood that the assertion of the read signal (RD) and entry into read mode may instead occur coincident with time t3 and the termination of the integration period.

Those skilled in the art will recognize that the time to analog converter operation described above with reference to FIGS. 2 and 3 is of the "reverse" mode type where the time measurement is commenced with the avalanche event (SPAD detection) and ended with the start of the next pixel reset.

In an alternative mode, the time to analog converter operation could instead be operated in the "forward" mode where the time measurement starts with a trigger event, such as an illumination, and is terminated by the avalanche event occurring in response to the trigger event. An example of such a sensor pixel is provided in United States Patent Application Publication No. 2014/0124652 (incorporated herein by reference; see FIGS. 3 and 4).

Operation of the sensor pixel 12 as a SPAD time to analog converter (TAC) in either the "forward" or "reverse" mode is contemplated by the embodiment shown in FIG. 1.

Reference is now once again made to FIG. 1. During pixel reset, the correlated double sampling (CDS) circuit 16 samples the signal 14 to detect any offsets or errors output from the source-follower read circuit. During pixel read, the correlated double sampling (CDS) circuit 16 again samples the signal 14 to detect the time to analog converter output signal (Vtac). The correlated double sampling (CDS) circuit 16 then generates the sampled signal 18 for output, that signal 18 having a voltage that is a function of the difference between the time to analog converter output signal (Vtac) and the sampled offset or error voltage. In this way, the correlated double sampling (CDS) circuit 16 effectively removes the offset or error from the time to analog converter output signal (Vtac).

Figure 4:
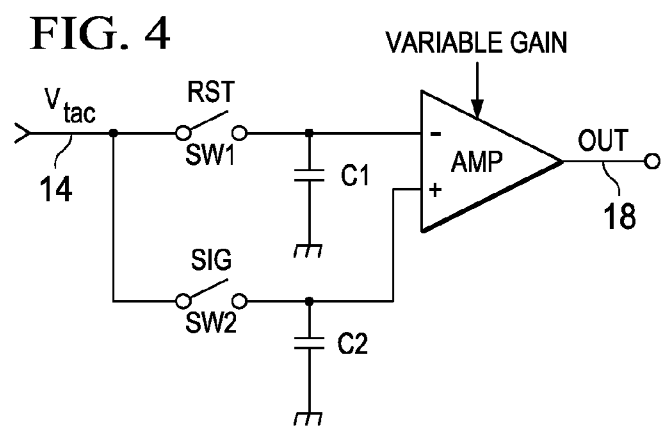
FIG. 4 is a circuit diagram for a correlated double sampling circuit within the system of FIG. 1.

Reference is now made to FIG. 4 showing a circuit diagram for the correlated double sampling circuit 16 within the system of FIG. 1. The circuit includes a first switch SW1 configured to selectively couple a first sampling capacitor C1 to receive the signal (Vtac) output from the sensor pixel 12. The switch SW1 is controlled by a reset signal (RST). The circuit further includes a second switch SW2 configured to selectively couple a second sampling capacitor C2 to receive the signal (Vtac) output from the sensor pixel 12. The switch SW1 is controlled by a sample signal (SIG). The circuit also includes a differential amplifier circuit AMP having an inverting input coupled to the first capacitor C1 and having a non-inverting input coupled to the second capacitor C2. The amplifier circuit AMP functions to take the difference between the voltage on the second capacitor and the voltage on the first capacitor to generate an output as signal 18. The amplifier circuit AMP has a controllable variable gain set by a variable gain signal (VARIABLE GAIN).

Figure 5:
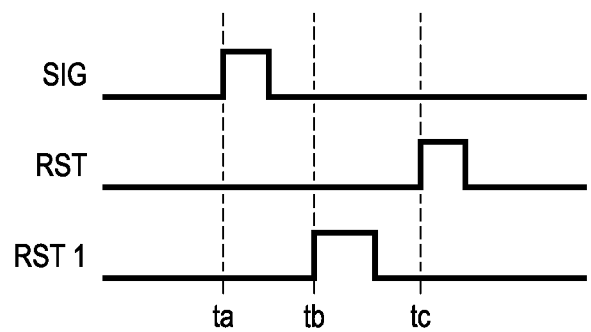
FIG. 5 is a timing diagram for operation of the correlated double sampling circuit of FIG. 4.

FIG. 5 shows a timing diagram for operation of the correlated double sampling circuit 16 of FIG. 4. At time ta, the second switch SW2 is actuated by signal SIG to sample the voltage Vtac of signal 14 for storage on capacitor C2. This operation occurs following completion of the integration and output of the time conversion (see, FIG. 3, time t4). At time tb, the pixel reset signal RST1 is asserted to reset the sensor pixel 14 (along with reset RST2). After reset, the voltage Vtac at the output of the sensor pixel 12 represents an error or offset. At time tc, the first switch SW1 is actuated by signal RST to sample the reset error or offset voltage for storage on capacitor C1. The amplifier AMP then calculates and outputs the difference between the two capacitor stored voltages.

Figure 6:
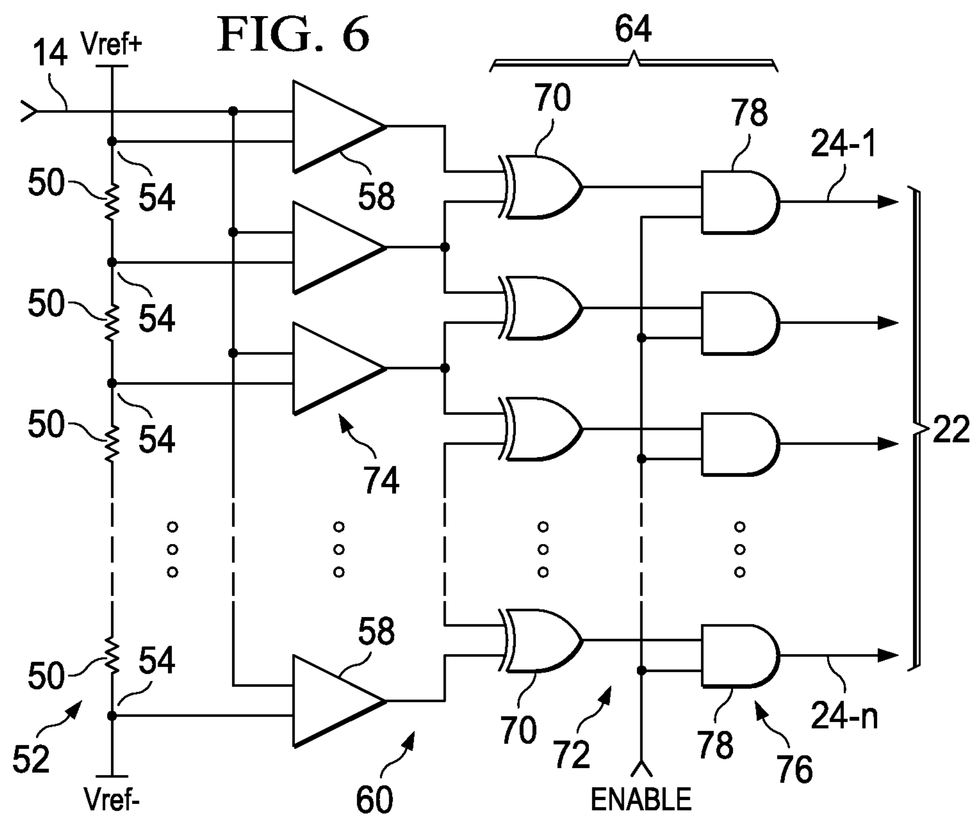
FIG. 6 is a circuit diagram of a flash analog-to-digital converter (ADC) circuit within the system of FIG. 1.

Reference is now made to FIG. 6 showing a circuit diagram of the flash analog-to-digital converter (ADC) circuit 20. The circuit 20 includes a conversion circuit 74 including a plurality of series connected resistors 50 (preferably of equal resistive value) coupled between a first voltage reference (Vref+) and a second voltage reference (Vref−). The resistors 30 form a resistive divider circuit 52 including a plurality of tap nodes 54. The circuit 74 further includes a plurality of comparator circuits 58 (corresponding in number to the number of tap nodes 54). Each comparator 58 has a first input coupled to receive the photon detect signal 14 and a second input coupled to the corresponding tap node 54. The resistive divider circuit 52 functions to generate a different reference voltage (selected between Vref+ and Vref− based on the values of the resistors 50) at each tap node 54. The output of the comparator is in a first logic state (for example, logic 1) if the voltage (Vtac) of the photon detect signal 14 exceeds the voltage at the coupled corresponding tap node; otherwise, the output of the comparator is a second logic state (for example, logic 0). The plurality of comparators 58 generate a multi-bit signal 60.

Because the received photon detect signal 14 has voltage which varies as a function of photon detection timing, and the resistive divider circuit 52 sets a plurality of different voltage ranges for comparison using the plurality of comparator circuits 58, each comparator circuit is accordingly operable to determine whether the photon detection occurred before or after a certain timing reference. The plurality of timing references together define the timing windows, with circuit 20 further functioning to identify the particular one of those timing windows within which the photon detection occurred.

To accomplish this goal, the circuit 20 further includes a discriminator circuit 64 including a plurality of exclusive-OR (XOR) circuits 70 equal in number to the number of bits of the signal 60. Each exclusive-OR circuit 70 includes a first input coupled to receive one of the bits of the signal 60 and a second input coupled to receive another one of the bits of the signal 60. In this implementation, a pair of adjacent bits of the signal 60 is applied to the inputs of each exclusive-OR circuit 70. The plurality of exclusive-OR circuits 70 generate a multi-bit signal 72 in the format of a thermometer code where only the bit corresponding to the timing window within which the photon detection occurred is set at the first logic state (logic 1). A gating circuit 76 using a plurality of pass (logic AND) gates 78 activated by an enable signal (ENABLE) selectively output the multi-bit signal 72 as the multi-bit digital signal 22.

The exclusive-OR circuits 70 of the discriminator circuit 64 function to logically combine the bits of the signal 60 to discriminate the timing location where the logic state of the bits of the 60 transition from the second logic state to the first logic. For example, the bits of signal 60 associated with timing references less than the time of photon detection will all have the second logic state and bits of the signal 60 associated with timing references greater than or equal to the time of photon detection will all have the first logic state. The one exclusive-OR circuit 70 in the discriminator circuit 64 with one input that receives a bit (of signal 60) having the first logic state and another input that receives an adjacent bit (of signal 60) having the second logic state, will output a signal having the first logic state (for example, logic 1). This is indicative of the timing window within which the photon detection occurred. All other exclusive-OR circuits 70 in the discriminator circuit 64 whose inputs receive adjacent bits (of signal 60) having the same logic state will output signals having the second logic state (for example, logic 0). The output signals from the exclusive-OR circuits 70 thus generate the multi-bit signal 72 in the format of the thermometer code (only one bit being in the first logic state) which is passed by gating circuit 76 as the multi-bit digital signal 22 in response to assertion of the enable signal. When the enable signal is de-asserted, all bits of the multi-bit digital signal 22 will be at the second logic state (logic 0) due to the logical-AND operation of the gating circuit 76.

Reference is now once again made to FIG. 1. Each digital counter circuit 26 comprises an edge triggered counter well known to those skilled in the art (for example, of the type where the data input is fixed at logic 1 and the bit line 24 is applied to the clock input of the counter). Each digital counter circuit 26 is associated with a different one of the timing windows. In response to a received positive edge on bit line 24, the digital counter circuit 26 will increment by one indicating that the photon detection occurred within the timing window associated with that counter circuit. Thus, in response to passing of the multi-bit signal 72 (thermometer code) to the plurality of digital counter circuits 26-1 to 26-*n* as the signal 22 in response to assertion of the enable signal, the one of the circuits 26 which receives the sole bit at the first logic state (logic 1) will increment. None of the other circuits 26 will be incremented because the other bits of the signal 22 are all at the second logic state (logic 0).

When the system 10 is operated over an extended period of time to capture a multiplicity of photon detections, the plurality of digital counter circuits 26-1 to 26-*n* will capture data relevant to the timing of photon detection over that period of time, this data producing a timing histogram showing the number of photon detections which occurred during each of the plurality of different timing windows.

Figure 7:
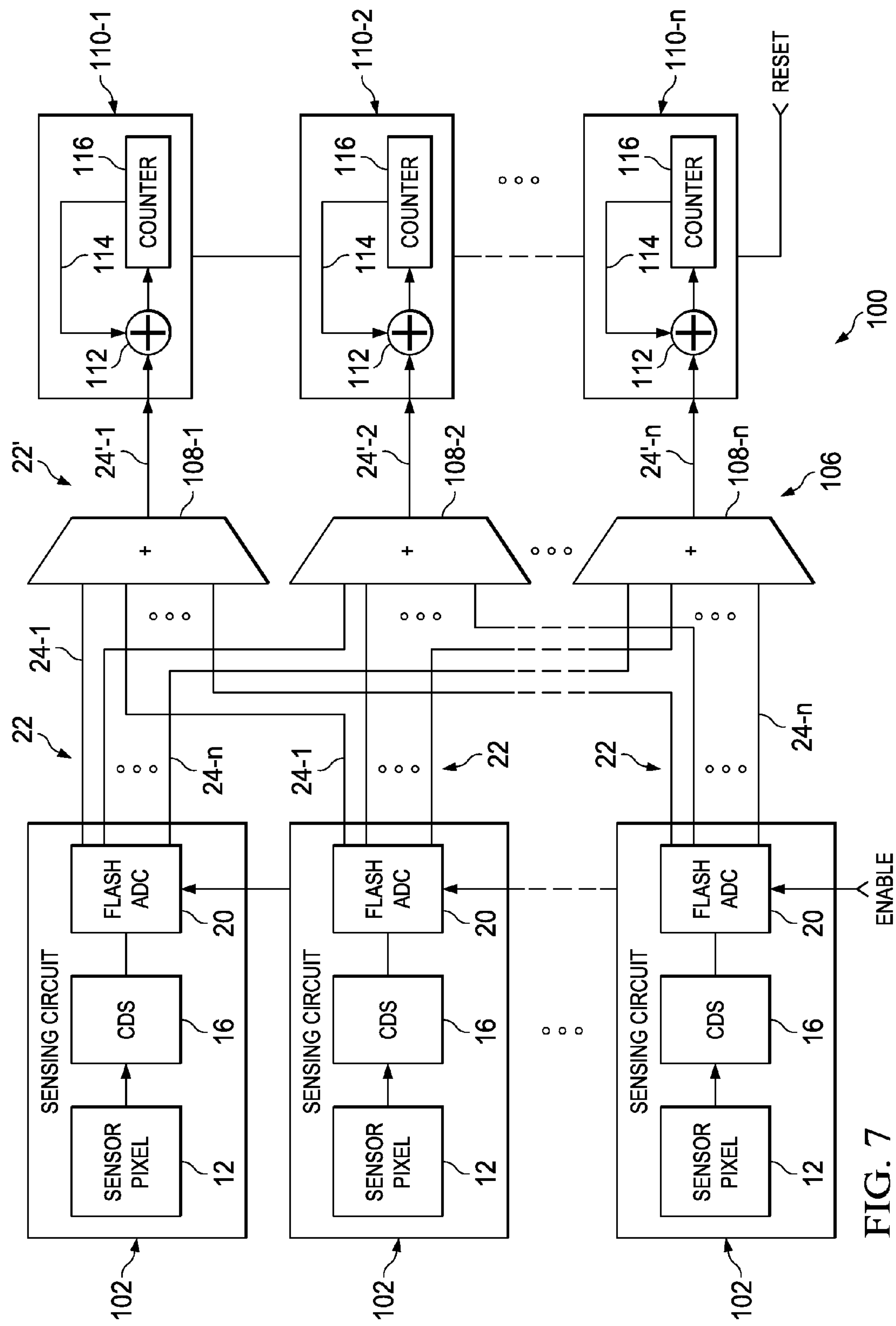
FIG. 7 is a block diagram of another embodiment of a system for generating direct timing histogram data in response to photon detection.

Reference is now made to FIG. 7 showing a block diagram of another embodiment of a system 100 for generating direct timing histogram data in response to photon detection. The system 10 described above in connection with FIG. 1 concerns photon detections made by a single sensor pixel 12. In certain embodiments it may be advantageous for photon sensing to be performed by a plurality of sensor pixels 12. The system 100 of FIG. 5 addresses this need.

The system 100 includes a plurality of sensing circuits 102. Each sensing circuit 102 is formed by a sensor pixel 12, a correlated double sampling (CDS) circuit 16 and a flash analog-to-digital converter (ADC) circuit 20 (which includes a conversion circuit 74 and a discriminator circuit 64) as shown, for example, in FIG. 1. Each sensing circuit 102 generates and outputs a multi-bit digital signal 22. A bit-wise addition circuit 106 functions to sum corresponding bits of the signals 22 output from each of the sensing circuits 102 to generate an accumulation signal 22'. The bit-wise addition circuit 102 includes a plurality of summation circuits 108, with each summation circuit having a plurality of inputs coupled to corresponding bits of the signals 22. For example, the first summation circuit 108-1 has inputs coupled to receive the bits 24-1 output from the n-plurality of sensing circuits 102 and generate a multi-bit accumulation signal 24'-1. A likewise bit connection is made with respect to summation circuits 108-2 through 108-*n*, with each circuit 108 generating a multi-bit accumulation signal 24'-2 to 24'-*n*.

The system 100 further includes a plurality of accumulation circuits 110. Each accumulation circuit 110 includes a summing circuit 112 having a first input coupled to receive the multi-bit accumulation signal 24' and a second input coupled to receive a current count value signal 114 output from a digital counter circuit 116. The values are added and output from the summing circuit 112 to be loaded into and stored by the counter circuit 116 as the new count value.

Each digital counter circuit 116 is associated with a different one of the timing windows. In response to the multi-bit accumulation signal 24', the digital counter circuit 116 will increment by the value of the multi-bit accumulation signal 24' which is indicative of the number of photon detections captured by all the sensing circuits 102 and which occurred within the timing window associated with that counter circuit. Thus, in response to passing of the multi-bit signal 72 (thermometer code) as the signal 22 from each sensing circuit 102 in response to assertion of the enable signal, the digital counter circuits 116 will be increment by a value equal sum of the number of photon detections across the plurality of photodetectors. It is possible, and indeed likely, in this embodiment for multiple ones of the counter circuits 116 to be incremented with each sensing period.

When the system 100 is operated over an extended period of time to capture a multiplicity of photon detections, the plurality of digital counter circuits 116 will capture data relevant to the timing of photon detection over that period of time, this data producing a timing histogram showing the number of photon detections captured by plural photodiodes 30 which occurred during each of the plurality of different timing windows.

In the system 100 embodiment, the plurality of sensor pixels 12 may be arranged in a multi-dimensional array format. In a preferred implementation of the system 100, the circuitry for the CDS and Flash ADC of each sensing circuit 102 is preferably implemented external to the array of sensor pixels 12 so as to not occupy area which otherwise could be advantageously used in providing as large a relative photodiode area as possible and/or reducing fill factor. All or some of the circuitry shown in FIG. 2 that is associated with the operation of each photodiode and TAC mode would preferably be implemented in the array itself adjacent to the location of the connected photodiode.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:

a first sensor pixel configured to detect a photon and output a first voltage proportional to a time of arrival of the detected photon;

a first conversion circuit configured to convert the first voltage output from the sensor pixel to a first multi-bit digital signal in the format of a thermometer code; and a plurality of counter circuits, one counter circuit per bit of the multi-bit digital signal, each counter configured to increment in response to an active logic state of said bit of the multi-bit digital signal, with accumulated count values in said plurality of counter circuits providing a timing histogram with respect to photon detection.

2. The circuit of claim 1, further comprising:

a second sensor pixel configured to detect a photon and output a second voltage proportional to a time of arrival of the detected photon; and a second conversion circuit configured to convert the second voltage output from the sensor pixel to a second multi-bit digital signal in the format of a thermometer code;

wherein each of said plurality of counter circuits is configured to increment in response to an active logic state of said bits of the first and second multi-bit digital signals, with accumulated count values in said plurality of counter circuit providing a timing histogram with respect to photon detection by said first and second sensor pixels.

3. The circuit of claim 2, wherein each counter circuit comprises:

a summing circuit configured to sum corresponding bits of the first and second multi-bit digital signals to generate an accumulation value; and a circuit configured to add the accumulation value to a current count value to generate a new count value for storage in the counter circuit.

4. The circuit of claim 3, wherein said summing circuit comprises a bit-wise addition circuit.

5. The circuit of claim 2, wherein each of the first and second pixel sensors includes a photodiode, and the photodiodes of the first and second pixel sensors are arranged in an array.

6. The circuit of claim 1, wherein the first sensor pixel comprises SPAD time to analog conversion circuit.

7. The circuit of claim 6, wherein the SPAD time to analog conversion circuit is configured to operate in a forward conversion mode.

8. The circuit of claim 6, wherein the SPAD time to analog conversion circuit is configured to operate in a reverse conversion mode.

9. The circuit of claim 1, wherein the first conversion circuit comprises:

an analog-to-digital converter circuit generating a digital signal; and a discriminator circuit configured to discriminate said digital signal and generate the first multi-bit digital signal in the format of the thermometer code;

said discriminator circuit further configured to pass the first multi-bit digital signal for output in response to an enable signal.

10. A method, comprising:

detecting a photon with a sensor pixel circuit to output a voltage proportional to a time of arrival of the detected photon;

converting the voltage output from the sensor pixel to a multi-bit digital signal in the format of a thermometer code; and incrementing individual ones of a plurality of counter circuits, one counter circuit per bit of the multi-bit digital signal, in response to an active logic state of said bit of the multi-bit digital signal with accumulated count values in said plurality of counter circuits providing a timing histogram with respect to photon detection.

11. The method of claim 10, wherein detecting comprises performed a SPAD time to analog conversion.

12. The method of claim 11, wherein the SPAD time to analog conversion performed in a forward conversion mode.

13. The method of claim 11, wherein the SPAD time to analog conversion is performed in a reverse conversion mode.

14. The method of claim 10, wherein converting comprises:

analog-to-digital converting to generating a digital signal;

discriminating said digital signal to generate the first multi-bit digital signal in the format of the thermometer code; and passing the first multi-bit digital signal for output in response to an enable signal.

15. The method of claim 10, wherein detecting comprises detecting photons with a plurality of pixel sensor circuits to generate a plurality of voltages proportional to time of arrival of the detected photons.

16. The method of claim 15, wherein converting comprises converting each of the plurality of voltages to a plurality of multi-bit digital signals, each in the format of a thermometer code.

17. The method of claim 16, wherein incrementing comprises incrementing each of said plurality of counter circuits in response to an active logic state of said bits of the plurality of multi-bit digital signals, with accumulated count values in said plurality of counter circuit providing a timing histogram with respect to photon detection by said plurality of sensor pixel circuits.

18. The method of claim 17, wherein incrementing further comprises:

summing corresponding bits of the first and second multi-bit digital signals to generate an accumulation value; and adding the accumulation value to a current count value to generate a new count value for storage in each counter circuit.

19. The method of claim 18, wherein summing comprises performing a bit-wise addition.

* * * * *